United States Patent
Kashiwazaki

(10) Patent No.: US 6,475,683 B1
(45) Date of Patent: Nov. 5, 2002

(54) COLOR FILTER, PROCESS FOR PRODUCING IT, AND LIQUID CRYSTAL PANEL

(75) Inventor: Akio Kashiwazaki, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 95 days.

(21) Appl. No.: 09/624,378

(22) Filed: Jul. 27, 2000

(30) Foreign Application Priority Data

Jul. 29, 1999 (JP) .......................................... 11-215619

(51) Int. Cl.⁷ .......................... G02B 5/20; G02F 1/1335
(52) U.S. Cl. .............................. 430/7; 347/107; 349/106
(58) Field of Search ............................ 430/7; 349/106; 347/106, 107

(56) References Cited

U.S. PATENT DOCUMENTS 5,837,045 A    11/1998  Johnson et al. .......... 106/31.85
5,888,679 A  * 3/1999  Suzuki et al. .................. 430/7

FOREIGN PATENT DOCUMENTS

| EP | 665 449 |   | 8/1995 |
|----|---------|---|--------|
| EP | 756 932 |   | 2/1997 |
| EP | 842 994 |   | 5/1998 |
| EP | 0 894 835 A | * | 2/1999 |
| JP | 11080633 |   | 3/1999 |

* cited by examiner

Primary Examiner—John A. McPherson
(74) Attorney, Agent, or Firm—Fitzpatrick, Cella, Harper & Scinto

(57) ABSTRACT

A process for producing a color filter which comprises arranging a light-transmitting colored part on a surface of a base plate by applying an ink onto the base plate by an ink-jet system. The ink comprises water, an aqueous organic solvent and a coloring material, and the coloring material contains a self-dispersing pigment having at least one species of hydrophilic group bonded directly or through a linker group to a surface thereof. The color filter obtained by the process may be used in a liquid crystal panel.

22 Claims, 4 Drawing Sheets

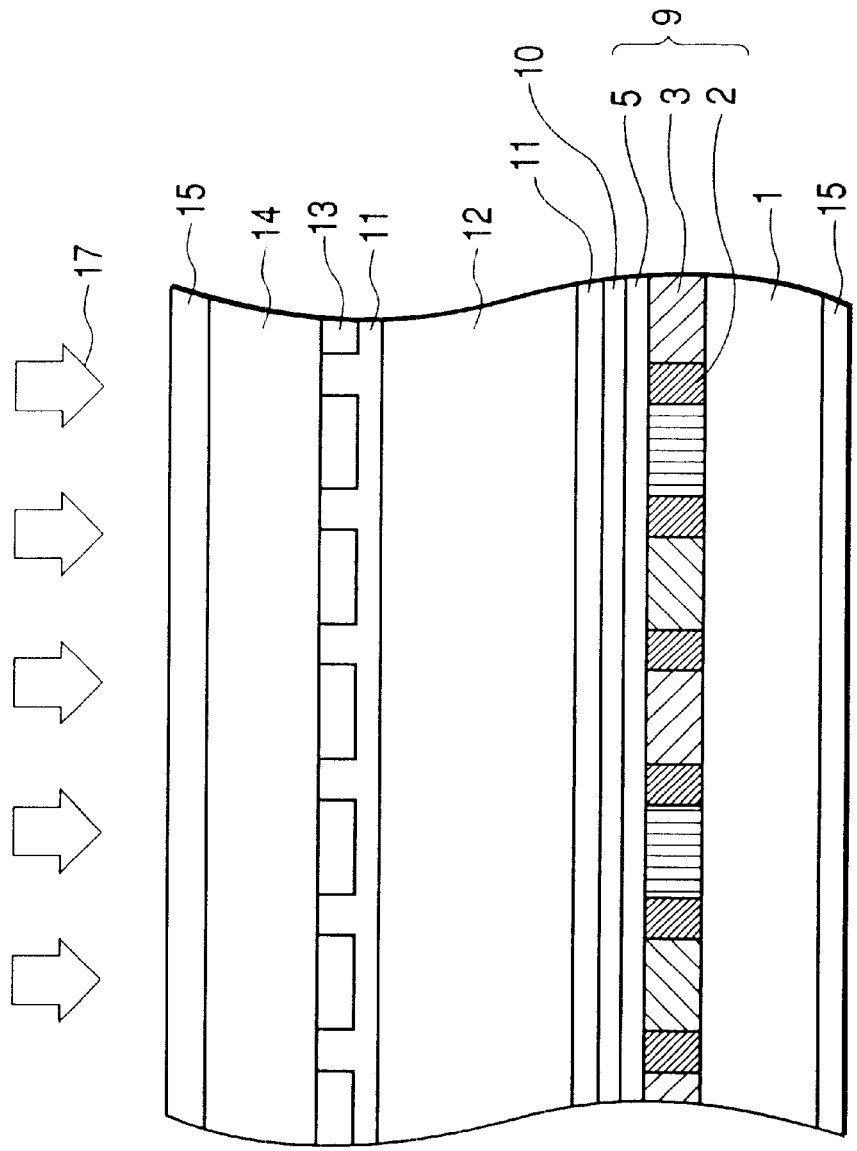

COLOR FILTER, PROCESS FOR PRODUCING IT, AND LIQUID CRYSTAL PANEL

BACKGROUND OF THE INVENTION

1. Field of the Invention

The present invention relates to a color filter having a light-transmitting colored part, a process for producing the color filter, and a liquid crystal panel employing the color filter.

2. Related Background Art

With the recent development of personal computers, especially portable personal computers, the demand for liquid crystal displays, in particular for liquid crystal color displays, has been increasing. In order to meet the increasing demand for liquid crystal color displays, a reduction in the cost thereof is necessary, especially a reduction with respect to the color filters which substantially comprise the cost. Although various methods have been proposed to meet the above needs while maintaining the properties necessary for color filters, there are still unsolved problems at present. For example, many proposals have been made for color filter manufacturing to use an ink-jet system having a potential of effective cost reduction. When the ink-jet system is used for color filter production, however, it is often difficult to achieve both stable ejection performance of the ink and a high standard of product reliability such as water resistance and light fastness of the color filter. In order to produce a light-transmitting colored part by the ink-jet method, a composition containing a coloring material such as a dye or a pigment in a mostly water aqueous solvent is used as the ink. When a dye is used as a coloring material, ejection stability of the ink in the ink-jet system is satisfactory to a certain extent, but the product reliability of the color filter thus produced is generally inferior to those produced using a pigment coloring material. On the other hand, when a pigment is used as a coloring material, the product reliability of the color filter is satisfactory to a certain extent, but the ejection stability of the ink in the ink-jet system is generally inferior to those using a dye coloring material. Further, there is a problem that pigment-type water-based inks are sometimes inferior in storage stability over a long period of time.

On such a background, studies have been made of ink-jet systems using water-based pigment inks which can achieve both ink-jet ejection stability and long storage stability. This is explained in detail below.

It is most preferable to use a pigment as the coloring material when the product reliability of the color filter is considered. When a pigment which is conventionally used for the color filters is used as a coloring material in an ink-jet water-based ink, it is necessary to disperse the pigment in the medium in a stable condition. In general, the pigment is dispersed in an aqueous medium by adding a dispersant to form a homogeneous dispersion system. However, there is a problem that sometimes the dispersion state is not satisfactory even if a dispersant is used, and thus the ink containing a dispersed pigment is inferior in long time storage stability.

Meanwhile, when an ink is used in an ink-jet system, the ink should be ejected from the tip of a minute nozzle (orifice) of the ink-jet recording head as a stable droplet. Thus, it is necessary to prevent solidification of the ink by drying at the orifice. When an ink containing a dispersant as described above is used in the ink-jet system, the dispersant component such as a resin may stick to the orifice without re-dissolution to cause clogging at the orifice or fault in ejection. There is also a problem with the water-based pigment ink containing a dispersant that it is so viscous that ejection may become unstable when continuous ejection and high speed image formation is carried out for a long time, due to the high resistance in the passage to the nozzle tip.

Japanese Laid-Open Patent Application No. 11-80633 discloses the production of a color filter by using an ink containing fine colored particles of a pigment covered with a film-forming resin having carboxyl groups, the particles being dispersed in an aqueous medium.

SUMMARY OF THE INVENTION

The inventors of the present invention, however, have determined that the pixels formed by an ink-jet system using an ink containing a pigment 19 covered with a thermo-crosslinking resin as shown in Japanese Laid-Open Patent Application No. 11-80633 do not have sufficient pixel transparency, which is one of the important properties for color filters. The reason why the pixels do not have enough transparency is believed to be that the pigment is localized in the pixel and such localization causes random reflection. The mechanism for the localization will be explained with FIGS. 1A, 1B and 1C. That is, when a base plate 1 is subjected to at least one of heat treatment and light irradiation after the attachment of the ink (FIG. 1A), cross-linking between the resins covering the pigment 19 and evaporation of the aqueous medium will occur (FIG. 1B). Thus, pigment particles tend to draw together and localize in the pixels (FIG. 1C) to cause random reflection at the regions of the pigment localization to reduce transparency. Based on such a finding, the inventors of the present invention have decided to develop a pigment ink which has properties highly suitable for an ink-jet system, which can provide pixels of high transparency, and which can provide color filters of required properties.

An object of the present invention is to provide a color filter and a production method thereof which utilizes a water-based pigment ink excellent in both long storage stability and ejection stability in an ink-jet system, which ink-jet system can effectively reduce production cost.

Another object of the present invention is to provide a liquid crystal panel containing a color filter of high quality, product reliability and low production cost, which color filter has light-transmitting colored parts formed by an ink-jet system using a water-based pigment ink.

According to one aspect of the present invention, there is provided a process for producing a color filter comprising a step of arranging a light-transmitting colored part on a surface of a base plate by applying an ink onto the base plate by an ink-jet system, wherein the ink comprises water, an aqueous organic solvent and a coloring material, and the coloring material contains a self-dispersing pigment having at least one species of hydrophilic group bonded directly or through a linker group to a surface thereof.

According to another aspect of the present invention, there is provided a color filter comprising a self-dispersing pigment at a light-transmitting colored part, wherein the light-transmitting colored part contains a self-dispersing pigment having a hydrophilic group bonded directly or through a linker group onto the surface.

According to still another aspect of the present invention, there is provided a liquid crystal panel comprising a first base plate having a pixel electrode, a second base plate having a common electrode, a liquid crystal composition layer enclosed between the first and second base plates, and a color filter having a light-transmitting colored part arranged corresponding to the pixel electrode, wherein the color filter is the color filter described above.

According to the present invention, a color filter of high quality can be produced at a low cost by advantageously using an ink-jet system with a pigment-type coloring material having excellent stability in long storage as well as stable ejection properties when used in an ink-jet system. Obtainable is a color filter having a light-transmitting colored part of high transparency, and the filter also has highly reliable properties such as water resistance and light-fastness.

FIGS. 2A, 2B and 2C schematically illustrate the formation process of the colored part of the color filter of the invention. An ink is applied to a base plate 1; a self-dispersing pigment 20 is uniformly dispersed in the ink (FIG. 2A). At least either of heat treatment and light irradiation causes cross-linking of the binder component in the ink and evaporation of the medium of the agent (FIG. 2B). As a result, the self-dispersing pigment 20 distributes uniformly between the cross-linked binder component (FIG. 2C), and the resultant film has a smooth surface to provide good transparency.

There have been already known self-dispersing pigments formed by bonding a hydrophilic group directly or through a linker group to the surface of the pigment, or inks using such pigments, as disclosed in, for example, U.S. Pat. No. 5,837,045. However, nothing has been disclosed about the properties of the pixels formed by an ink-jet system using such an ink in the color filter production, and it has not even been suggested that such an ink can form pixels having properties sufficient to be used in a color filter.

BRIEF DESCRIPTION OF THE DRAWINGS

FIG. 5 illustrates an example of a liquid crystal panel using a color filter obtained by the method of the present invention.

DETAILED DESCRIPTION OF THE INVENTION

Figure 1A:
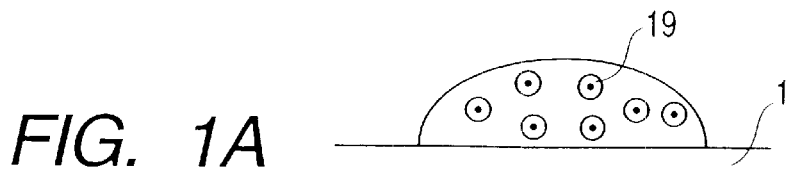
FIGS. 1A, 1B and 1C illustrate a prior art production process of pixels of a color filter using an ink containing pigment particles covered with a film-forming resin.
Figure 1B:
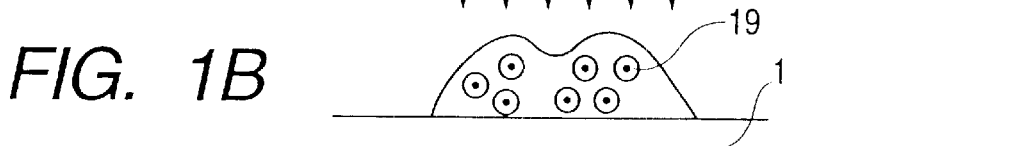
Figure 1C:
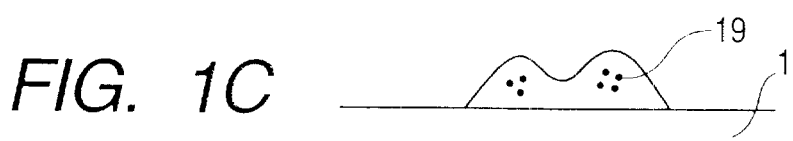
Figure 2A:
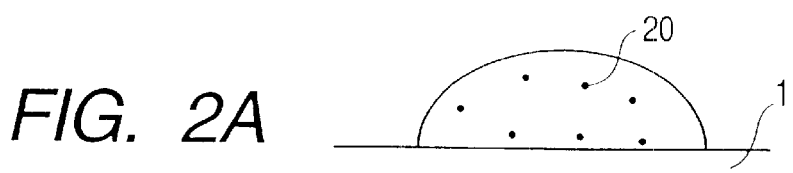
FIGS. 2A, 2B and 2C illustrate a formation process of a colored part of a color filter using an ink used in the present invention.
Figure 2B:
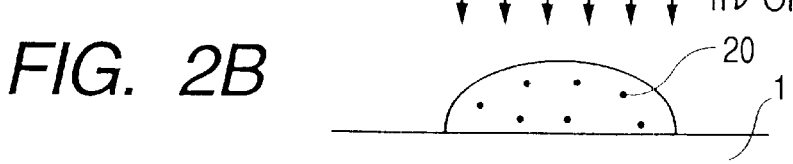
Figure 2C:

The present invention is described in detail referring to the drawings.

FIGS. 3A to 3D illustrate a process for producing a color filter of the present invention.

Figure 3A:
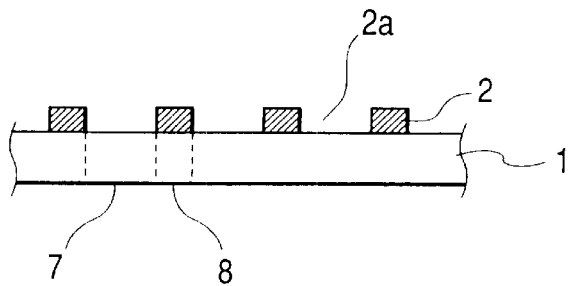
FIGS. 3A, 3B, 3C and 3D illustrate a production process of a color filter according to the method of the present invention.

Base plate 1 is usually made of glass. However, any other material may be used, so long as characteristics such as transparency (light transmittancy) and mechanical strength usually required for the liquid crystal color filter are satisfied. For example, a transparent acrylic resin can be used as the base plate. First, as shown in FIG. 3A, the black matrix is provided on the base plate 1. The black matrix can be provided using known method and materials. This black matrix is to form a light-shielding part 8 and is preferably prepared by photolithography to pattern a layer of a black pigment resist to make openings 2a corresponding to the light transmitting part 7 of any shape. The resist layer is formed using a resin composition containing a black pigment (black pigment resist). Preferably, the thickness of the resist layer is 0.5 $\mu$m or more. Such a thickness gives sufficient optical density for reliable light shielding effect. It also prevents the ink applied to an opening by the ink-jet system from overflowing from the opening and flowing into the next opening, thus effectively preventing mixing of inks of different colors. The upper limit of the resist layer thickness is not limited specifically so long as it is practical, but preferably about 5 $\mu$m, for example.

Figure 3B:
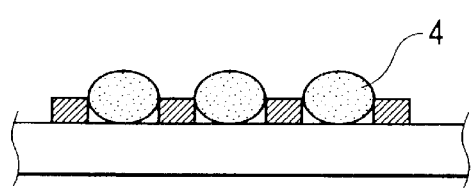
Figure 3C:
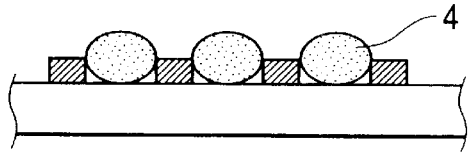

Then, the ink 4 is applied to the opening 2a by an ink-jet system as shown in FIG. 3B. The ink-jet system may be a bubble jet type employing an electrothermal transducer as an energy-generating element or a piezo jet type employing a piezo element. In this case, the area and pattern to be colored can be determined optionally. As the ink 4 (water-based pigment ink), an ink comprised at least of water, an aqueous organic solvent and a coloring material, where the coloring material contains a self-dispersing type pigment having at least one kind of hydrophilic group bonded to its surface directly or through a linker group is used.

As a raw material to prepare such a self-dispersing pigment, any inorganic organic pigments can be used so long as they are suitable for a color filter. Organic pigments include azo pigments such as azo lakes, insoluble azo pigments, condensed azo pigments, and chelate azo pigments; polycyclic pigments such as phthalocyanine pigments, perylene pigments, perynone pigments, anthraquinone pigments, quinacridone pigments, dioxazine pigments, thioindigo pigments, isoindolinone pigments, and quinophthalone pigments. Inorganic pigments include oxides such as titanium oxide, red iron oxide, chromium oxide, black iron oxide; cadmium yellow; chrome vermilion, prussian blue, ultramarine, and yellow iron oxide. In view of color tone, organic pigments are preferably used.

The self-dispersing pigments used as a coloring material in the present invention preferably have an ionicity with hydrophilic groups bonded to the surface thereof. Examples of the hydrophilic group bonded to the surface of the anionically charged pigment include —COOM, —SO$_3$M, —PO$_3$HM, —PO$_3$M$_2$, —SO$_2$NH$_2$ and —SO$_2$NHCOR, wherein M is hydrogen, alkali metal, ammonium or organic ammonium, R is an alkyl group of 1 to 12 carbons, a phenyl group unsubstituted or substituted with C$_1$–C$_5$ alkyl, or a naphthyl group unsubstituted or substituted with C$_1$–C$_5$ alkyl. Of these, anionically charged pigments with —COOM or —SO$_3$M bonded to the surface thereof are preferably used in the present invention.

When "M" in the above-described hydrophilic groups represents an alkali metal, examples of the alkali metal include lithium, sodium and potassium, and examples of the organic ammonium include mono-, di- and trimethylammonium and mono-, di- and triethylammonium.

An anionically charged pigment having —COONa on the surface can be prepared, for example, by oxidizing a pigment with sodium hypochlorite. Of course, the present invention is not limited to such an embodiment.

With cationically charged pigments, the hydrophilic group bonded to the surface of the pigment directly or through a linker group is preferably a quaternary ammonium group, more preferably, one of the following quaternary ammonium groups:

—$NH_3^+$, —$NR_3^+$, (R is as defined above),

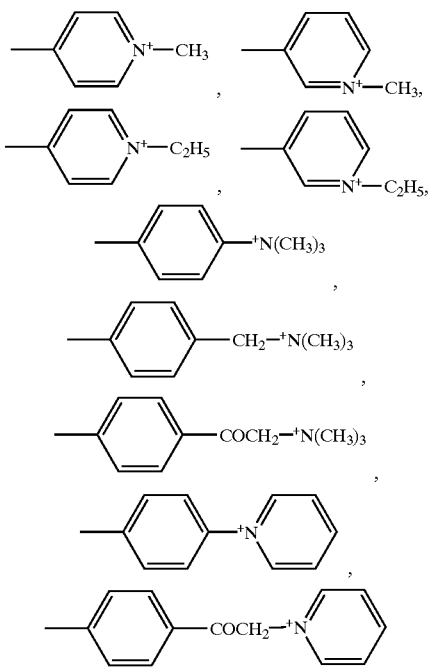

One method for producing cationically charged self-dispersing pigments having hydrophilic groups as mentioned above bonded to the surface thereof is to bond the N-ethylpyridyl group of the following structure:

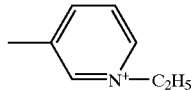

to the surface of a pigment by treating the pigment with 3-amino-N-ethylpyridinium bromide. Of course, the present invention is not limited to this method.

In the present invention, it is also preferable to bond a hydrophilic group as mentioned above through a linker group to the surface of a pigment. Examples of such groups include alkylene groups of 1 to 12 carbons, a phenylene group unsubstituted or substituted with $C_1$–$C_5$ alkyl or a naphthyl unsubstituted or substituted with $C_1$–$C_5$ alkyl. Specific examples of the hydrophilic group bonded through a linker group to the surface of a pigment include —$C_2H_4COOM$, —ph—$SO_3M$ and —$C_5H_{10}NH_3^+$, where ph is phenyl, and M is as defined above, in addition to the hydrophilic groups already mentioned above, but not limited thereto.

More than one kind of hydrophilic group can be bonded to the same surface of a pigment particle, so long as the groups are of the same polarity.

The self-dispersing pigment used for the water-based pigment ink in the present invention is cationically or anionically charged due to the hydrophilic groups bonded to the surface thereof. Since self-dispersibility is due to ionic repulsion, and the hydrophilic group also increases hydrophilicity, the pigment is stably dispersed in an aqueous medium, and the particle size of the pigment and viscosity do not increase during long storage of the water-based ink containing such a pigment. Further, since the self-dispersing pigment itself shows high dispersibility in an aqueous medium of the ink, good ejection properties can be obtained when such an ink is used in an ink-jet system, and the use of a conventional dispersant can be omitted or the amount of the dispersant can be reduced effectively.

In the present invention, the ink may contain plural species of the self-dispersing pigments to control the color tone. The amount of self-dispersing pigment to be added to a pigment ink according to the present invention is preferably within a range of from 0.1 to 20% by weight, more preferably from 1 to 15% by weight, based on the total weight of the ink. In addition to the self-dispersing pigment, dyes may be added to control the color tone of the ink. Such dyes are not limited specifically, so long as they are suitable for an ink-jet system and for formation of the light-transmitting colored part of a color filter.

Further, the ink may contain a water-soluble or water-dispersible compound, preferably a water-soluble or water-dispersible resin component, as a binder component. As binder components, natural resins, acrylic resins, polyester resins, polyurethane resins, polyvinyl resins, amino resins, epoxy resins, polyether resins, etc. can be used. The binder component may be contained at a concentration of 0.1–20%, preferably 0.2–15% of the total weight of the ink.

Use of a curable resin composition as the binder component can give a light-transmitting colored part having improved water resistance and light fastness. Such curable resin components are preferably those curable by either of heat treatment and light irradiation treatment, including acrylic resins and melamine resins having carboxyl groups and hydroxy groups, but not limited thereto.

The aqueous medium of the water-based pigment coloring materials in the present invention is mainly composed of water and a water-soluble organic solvent. It is preferable to use an aqueous organic solvent which can prevent the drying of the ink when it is used in an ink-jet system or during the storage thereof. It is also preferable to use deionized water not the common water containing various ions.

Specific examples of the water-soluble organic solvent used in the present invention include alkyl alcohols having 1 to 5 carbon atoms, such as methyl alcohol, ethyl alcohol, n-propyl alcohol, isopropyl alcohol, n-butyl alcohol, sec-butyl alcohol, tert-butyl alcohol, isobutyl alcohol and n-pentanol; amides such as dimethylformamide and dimethylacetamide; ketones and ketone alcohols such as acetone and diacetone alcohol; ethers such as tetrahydrofuran and dioxane; oxyethylene or oxypropylene copolymers such as diethylene glycol, triethylene glycol, tetraethylene glycol, dipropylene glycol, tripropylene glycol, polyethylene glycol and polypropylene glycol; polyalkylene glycols such as polyethylene glycol and polypropylene glycol; alkylene glycols the alkylene moiety of which has 2 to 6 carbon atoms, such as ethylene glycol, propylene glycol, trimethylene glycol and triethylene glycol; 1,2,6-hexanetriol; glycerol; lower alkyl ethers such as ethylene glycol monomethyl (or monoethyl) ether, diethylene glycol monomethyl (or monoethyl) ether and triethylene glycol monomethyl (or monoethyl) ether; lower dialkyl ethers of polyhydric alcohols, such as triethylene glycol dimethyl (or diethyl) ether and tetraethylene glycol dimethyl (or diethyl) ether; alkanolamines such as monoethanolamine, diethanolamine and triethanolamine; sulfolane; N-methyl-2-pyrrolidone; 2-pyrrolidone; and 1,3-dimethyl-2-imidazolidinone. The water-soluble organic solvents mentioned above may be used alone or in combinations thereof.

In the present invention, the content of the water-soluble organic solvent as mentioned above is suitably within a range of from 10 to 70% by weight based on the total weight of the ink.

In addition to the above-mentioned components, the water-based pigment ink may contain other additives such as surfactants, anti-foaming agents, preservatives, and anti-mold agents, to have desired physical properties as an ink.

When a color filter is produced without providing an ink-receiving layer, it is preferable that the ink is repelled at a matrix portion to prevent mixing of the inks applied to respective openings bordered by the matrix. For this purpose, the ink preferably has a high surface tension. In detail, the surface tension of the ink as a whole is preferably 50 mN/m(dyne/cm) or more. The dispersibility of a self-dispersing pigment is hardly affected by the components of the medium so long as it is an aqueous medium, so that the pigment can show excellent dispersibility in a medium of high surface tension. One of the ways to increase the surface tension of the ink is to increase the ratio of the hydrophilic monomer component in the curable resin. Thus, it is preferable that the hydrophilic monomer is contained in the curable resin at a concentration of 50% or more, more preferably 70% or more, further preferably 80% or more, in general. As the hydrophilic monomer component, there are those having carboxyl group such as acrylic acid, methacrylic acid, propionic acid, those having hydroxy group such as hydroxymethyl methacrylate, hydroxyethyl methacrylate, hydroxymethyl acrylate and hydroxyethyl acrylate, and those having amide or derivatives thereof such as acrylamide, methacrylamide, N-methylolacrylamide, and N-methylolmethacrylamide.

The ink applied to the opening 2a by an ink-jet system is then made into a film by a proper treatment such as drying to form a light-transmitting colored part on the base plate 1. When a resin composition curable by heat and/or light is contained in the ink as a binder component, the light-transmitting colored part can be formed by applying at least either of heating treatment and light irradiation to cure the ink and make a film thereof.

Figure 3D:
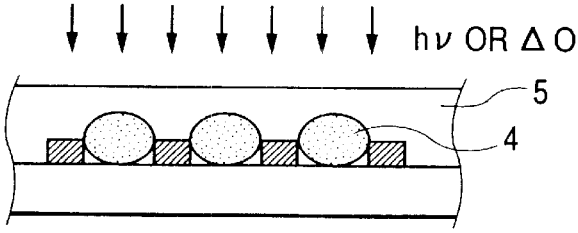

Then, if necessary, a protection layer is formed on the plate as shown in FIG. 3D. The protection layer 5 can be formed by applying a resin material, which is curable by light irradiation or heat treatment or both. As a protection layer, an inorganic film formed by vapor-depositing or spattering can be also used. Any materials can be used to form the protection layer, so long as the formed protection layer has sufficient transparency as required for the color filter and can withstand the later processes such as an ITO formation process and an oriented film formation process.

Figure 4A:
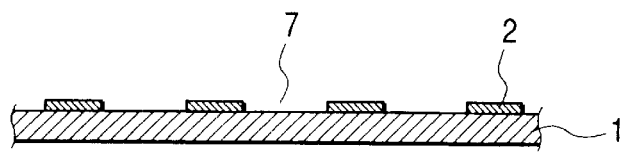
FIGS. 4A, 4B, 4C, 4D and 4E illustrate another production process of a color filter according to the method of the present invention.

According to the present invention, an ink-receiving layer is formed on a base plate, to which an ink containing a self-dispersing pigment is applied to form a color filter. One example of this method is explained referring to FIGS. 4A to 4E. FIG. 4A shows a light-transmitting base plate 1 on which a pattern of black matrix has been formed. The black matrix can be formed in the same manner as explained above. Reference numeral 7 denotes the light-transmitting opening.

Figure 4B:
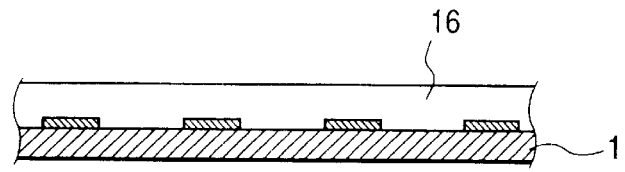

Then an ink-receiving layer 16 is formed by forming a layer containing a curable resin composition on the base plate 1 (FIG. 4B). The ink-receiving layer 16 may be made from conventional materials.

The ink-receiving layer 16 may contain additives such as surfactants, dye-fixing agents (waterproofing agents), anti-foaming agents, antioxidants, fluorescent whitening agents, UV absorbing agents, dispersants, viscosity-controlling agents, pH-controlling agents, anti-mold agents, and plasticizers. The additives may be selected arbitrarily from known compounds to meet the purpose.

The ink-receiving layer 16 can be formed by any coating method such as spin coating, roll coating, bar coating, spray coating, dip coating and the like. The layer may be prebaked, if necessary.

Figure 4C:
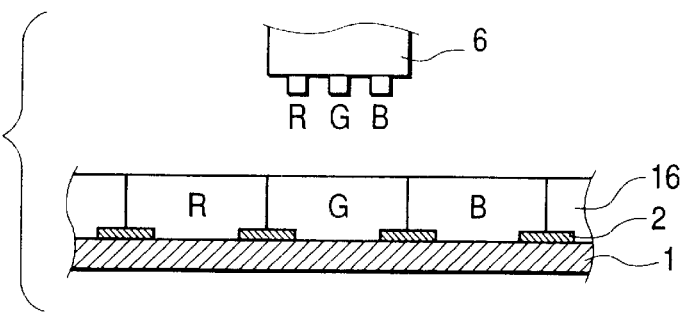
Figure 4D:
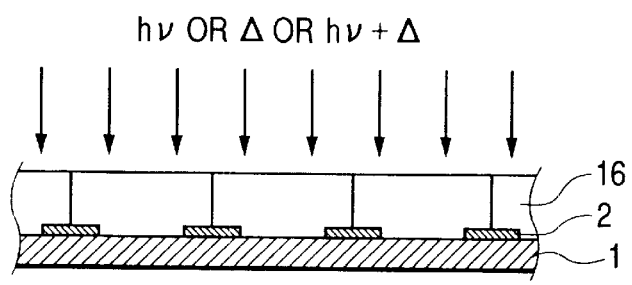
Figure 4E:
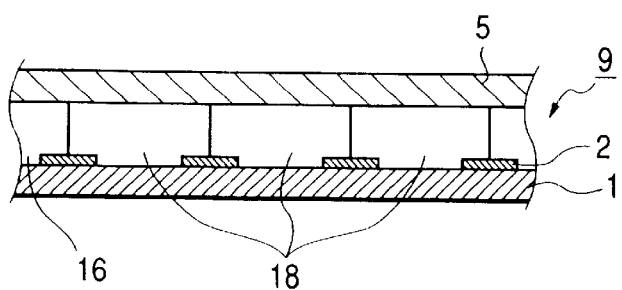

Next, the aforementioned ink is applied on a prescribed part of the protection layer by an ink-jet system to color the pixel forming areas (FIG. 4C). Curing can be carried out by any method suitable for curing the resin component used in the ink-receiving layer. For example, heating or light-irradiation or both is carried out to form the light-transmitting colored part 18 of respective colors.

After that, if necessary, the protective layer 5 may be formed on the cured ink-receiving layer as described above (FIG. 4E).

Alternatively, the black matrix may be cured before the application of the ink to the ink-receiving layer 16 (FIG. 4C) to reduce the inkabsorbency of the black matrix.

FIG. 5 shows a schematic sectional view illustrating an embodiment of a display part of a liquid crystal display element in which the color filter according to the above embodiment of the present invention has been incorporated. This embodiment is a TFT (thin film transistor) color liquid crystal element.

The TFT liquid crystal element is constructed by sticking together a base plate 1 bearing the color filter 9 and a base plate 14 having TFT (not shown) with a sealing compound (not shown) and enclosing a liquid crystal layer 12 in the gap of about 2 to 5 μm wide between the plates. The TFT and transparent pixel electrodes 13 are provided on the inner surface of one of the base plates in a matrix pattern, and the light-transmitting colored parts 3 of the color filter 9 are disposed on the inner surface of the other base plate at positions corresponding to the pixel electrodes 13. A transparent counter (or common) electrode 10 is formed all over to cover the color filter 9. Further, orientation film 11 is formed on the inner surfaces of both bases. Liquid crystal molecules can be aligned in a fixed direction by rubbing treatment of the orientation film. Polarizing plates 15 are bonded to the outer surfaces of both glass base plates. As the light source of the back light 17, a combination of a fluorescent lamp and a scattering light plate (both not shown) are used. The liquid crystal compound in the enclosed liquid crystal layer 12 functions as a shutter for changing the transmittance of light from the back light, thereby making a display.

In the liquid crystal display element according to the present invention, any liquid crystal compounds such as a TN liquid crystal and ferroelectric liquid crystal (FLC) may be suitably used.

The respective components may take various constitutions, not limited to the illustrated constitution of FIG. 5. For example, the common electrode may be formed in a stripe pattern, or both of black matrix 2 and color filter components 9 may be formed on the TFT base.

EXAMPLE 1

A glass base plate was coated with a black pigment resist (trade name: CK-S171B, a product of FUJI HANTO KK) comprised of an acrylic resin, multifunctional acrylic monomer and carbon black. The plate was then subjected to light exposure, development, and heat treatment to form a black matrix 1.0 μm thick thereon. The black matrix had openings of 200 μm×80 μm. Then, to an opening bordered by the matrix, about 200 pl (10 droplets) of red, green blue ink was applied by an ink-jet method with an ejection frequency of 500 Hz.

The composition of the inks is as follows.

Self-dispersing organic pigment 1 5 wt %

Binder component 3 wt %

(acrylic acid—methyl methacrylate copolymer of copolymer ratio 30:70)

Diethylene glycol 20 wt %
Isopropyl alcohol 5 wt %
Pure water 67 wt %

Preparation of Self-Dispersing Organic Pigments

The pigments were prepared as follows, First, blue pigment was prepared. To a solution of 5.5 g of hydrochloric acid dissolved in 6 g of water, 1.8 g of 4-aminobenzoic acid was added and maintained at a temperature of 10° C. or lower. A solution prepared by dissolving 2 g of sodium nitrite into 10 g of water was added and stirred. Then 20 g of C.I. Pigment Blue 15:6 was added and stirred to obtain a slurry. The slurry was filtered, and the pigment particles were fully washed with water and then dried. The pigment particles were then dispersed in water and desalted using a reverse osmosis membrane. The resultant pigment dispersant was concentrated to a pigment concentration of 10% to obtain a dispersion of an anionic self-dispersing blue pigment having carboxyl groups bonded to the pigment surface via phenyl groups, as represented by the following formula.

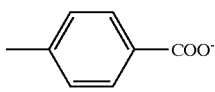

Red and green self-dispersing pigments were also prepared in the same manner as above, using C.I. Pigment Red 254 and C.I. Pigment Green 7, respectively. The surface tension of the thus obtained inks was 42 mN/m(dyne/cm).

Using these inks, openings in the black matrix on the base plate were colored, and then heat treated at 240° C. for 30 minutes to cure the ink. Then, a two-part type thermosetting resin material (trade name: Optomer SS6688, a product of JSR) was applied onto the entire base plate surface by spin coating, and the base plate was subjected to heat treatment of 230° C. for 60 minutes to cure the resin. A color filter was thus obtained.

The prepared color filter was observed under an optical microscope, where problems such as color bleeding and uneven coloring were not observed. Using this color filter, serial processes of ITO (electrode) formation, orientation film formation, and enclosure of liquid crystal material were carried out to manufacture a color liquid crystal element (liquid crystal panel) as shown in FIGS. 3A to 3D. The resulting liquid crystal element exhibited was excellent properties.

Using the liquid crystal element of this example, continuous running operations of 1000 hours in a temperature range between —20° C. and 60° C. were carried out, no disorder resulted. Further, when a running operation of a total of 1000 hours was carried in sunshine, no change was observed in transmittance and color tone.

EXAMPLE 2

A glass base plate was coated with a black pigment resist (trade name: CK-S171B, a product of Fuji Hanto KK) comprised of an acrylic resin, multifunctional acrylic monomer and carbon black. The plate was then subjected to light exposure, development, and heat treatment to form a black matrix 1.0 μm thick thereon. The black matrix bordered openings of 200 μm×80 μm. Then, about 200 pl (10 droplets) of red, green or blue ink was applied by an ink-jet method to one opening with an ejection frequency of 3 KHz.

The composition of the inks is as follows:
Self-dispersing organic pigment 1 5 wt %
Binder component 3 wt %
(acrylic acid—methyl methacrylate copolymer of copolymer ratio 80:20)
Diethylene glycol 20 wt %
Pure water 72 wt %

The surface tension of the thus obtained inks was 53 mN/m(dyne/cm).

Using these inks, openings in the black matrix on the base plate were colored, and then heat treated at 240° C. for 30 minutes to cure the ink. Then, a two-part type thermosetting resin material (Trade name: Optomer SS6688, a product of JSR) was applied onto the entire base plate surface by spin coating, and the base plate was subjected to heat treatment of 230° C. for 60 minutes to cure the resin. A color filter was thus obtained.

The prepared color filter was observed under an optical microscope, where problems such as color bleeding and uneven coloring were not observed. Using this color filter, serial processes of ITO (electrode) formation, orientation film formation, and enclosure of liquid crystal material were carried out to manufacture a color liquid crystal element (liquid crystal panel) as shown in FIGS. 3A to 3D. The resulting liquid crystal element exhibited excellent properties.

Using the liquid crystal element of this example, continuous running operations of 1000 hours in a temperature range between —20° C. and 60° C. were carried out, no disorder resulted. Further, when a running operation of a total of 1000 hours was carried out in sunshine, no change was observed in transmittance and color tone.

It will also be possible to make a reliable color filter and a liquid crystal panel using it as in Examples 1 and 2 using the following self-dispersing pigments having any one of the following hydrophilic groups bonded to the pigment surface:
—COONa,

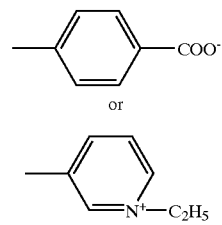

As described above, the color filters produced according to the method of the present invention have a light-transmitting colored part of high transparency free from color bleeding or uneven coloring. The filter also has highly reliable properties such as water resistance, in addition to the necessary properties such as heat resistance, solvent resistance and resolution with a low production cost.

What is claimed is:

1. A process for producing a color filter comprising a step of arranging a light-transmitting colored part on a surface of a base plate by applying an ink onto the base plate by an ink-jet system, wherein the ink comprises water, an aqueous organic solvent and a coloring material, and the coloring material contains a self-dispersing pigment having a —COOM group bonded directly or through a linker group to a surface thereof, wherein M represents hydrogen, alkali metal, ammonium or organic ammonium.

2. The process according to claim 1, wherein the linker group is selected from the group consisting of an alkyl group of 1 to 12 carbons, a substituted or unsubstituted phenyl group, and a substituted or unsubstituted naphthyl group.

3. The process according to claim 1, wherein the step of arranging a light-transmitting colored part further comprises the substeps of:

(i) selectively providing a light-shielding part on the base plate, and (ii) applying the ink to an opening surrounded by the light-shielding parts.

4. The process according to claim 3, further comprising a step of curing the ink applied to the opening by at least one of heat treatment and light irradiation to form a hardened film of the ink in the opening, wherein the ink contains a resin curable by at least one of heat treatment and light irradiation.

5. The process according to claim 3 wherein the light-shielding part constitutes a black matrix.

6. The process according to claim 3 wherein the light-shielding part contains a resist containing a black pigment.

7. The process according to claim 3, wherein the light-shielding part has a thickness of 0.5 µm or more.

8. The process according to claim 3, further comprising a step of providing a resin layer over the light transmitting colored part and the light-shielding part.

9. The process according to claim 8, wherein the resin layer over the light-shielding part is formed by curing the resin layer by at least one of heat treatment and light irradiation.

10. The process according to claim 1, wherein the ink contains a water-soluble or water-dispersible compound, or a water-soluble or water-dispersible resin component.

11. The process according to claim 10, wherein the water-soluble or water-dispersible compound or the water-soluble or water-dispersible resin component is contained at 0.1 to 20 wt % based on the total weight of the ink.

12. The process according to claim 1, wherein the color filter is used for a liquid crystal element.

13. A color filter comprising a light-transmitting colored part, wherein the light-transmitting colored part contains a self-dispersing pigment having a —COOM group bonded directly or through a linker group onto a surface of the pigment, wherein M represents hydrogen, alkali metal, ammonium or organic ammonium.

14. The color filter according to claim 13, wherein the linker group is selected from the group consisting of an alkyl group of 1 to 12 carbons, a substituted or unsubstituted phenyl group, and a substituted or unsubstituted naphthyl group.

15. The color filter according to claim 13, wherein the colored part is present in plurality and in order.

16. The color filter according to claim 15, a light-shielding part is present between the colored parts.

17. The color filter according to claim 16, wherein the light-shielding part constitutes a black matrix.

18. The color filter according to claim 16, wherein the light-shielding part contains a resist containing a black pigment.

19. The color filter according to claim 16, wherein the light-shielding part has a thickness of 0.5 µm or more.

20. The color filter according to claim 16, wherein the light-shielding part and the colored parts are covered with a resin layer.

21. The color filter according to claim 13, wherein the color filter is a color filter for a liquid crystal element.

22. A liquid crystal panel comprising a first base plate having a pixel electrode, a second base plate having a common electrode, a liquid crystal composition layer enclosed between the first and second base plates, and a color filter having a light-transmitting colored part arranged corresponding to the pixel electrode, wherein the color filter is the color filter according to claim 21.

* * * * *